(12) United States Patent
Kim et al.

(10) Patent No.: US 9,646,673 B2
(45) Date of Patent: May 9, 2017

(54) ADDRESS DETECTION CIRCUIT, MEMORY SYSTEM INCLUDING THE SAME

(71) Applicant: SK hynix Inc., Gyeonggi-do (KR)

(72) Inventors: Chang-Hyun Kim, Gyeonggi-do (KR); Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 697 days.

(21) Appl. No.: 14/085,531

(22) Filed: Nov. 20, 2013

(65) Prior Publication Data

US 2014/0355371 A1  Dec. 4, 2014

(30) Foreign Application Priority Data

May 28, 2013 (KR) .................. 10-2013-0060475

(51) Int. Cl.
 *G11C 8/00* (2006.01)
 *G11C 11/408* (2006.01)
 *G11C 11/406* (2006.01)

(52) U.S. Cl.
 CPC .......... *G11C 11/408* (2013.01); *G11C 11/406* (2013.01)

(58) Field of Classification Search
 CPC .......................... G11C 11/408; G11C 11/406
 USPC ..... 365/230.01, 230.04, 230.06, 230.08, 241
 See application file for complete search history.

(56) References Cited

U.S. PATENT DOCUMENTS

| 5,860,104 A | * | 1/1999 | Witt ..................... G06F 9/3004 |
| | | | 711/126 |
| 7,313,047 B2 | | 12/2007 | Kim |
| 2005/0157577 A1 | | 7/2005 | Barth et al. |
| 2011/0141836 A1 | * | 6/2011 | Luthra .................. G11C 11/406 |
| | | | 365/222 |

FOREIGN PATENT DOCUMENTS

| CN | 101034588 | 9/2007 |
| CN | 102656638 | 9/2012 |
| KR | 1020050011823 | 1/2005 |
| KR | 1020110074285 | 6/2011 |
| TW | 201222254 | 6/2012 |

OTHER PUBLICATIONS

Office Action issued by the Taiwanese Intellectual Property Office on Mar. 1, 2017.

* cited by examiner

*Primary Examiner* — Tha-O H Bui
(74) *Attorney, Agent, or Firm* — IP & T Group LLP

(57) ABSTRACT

An address detection circuit includes an address storage unit suitable for receiving an address when an active command is activated, and storing recently inputted N number of addresses; and an address determination unit suitable for determining whether an address currently inputted to the address storage unit is already inputted at least a threshold number of times in each period that the active command is activated M (1≤M≤N) number of times, based on the N number of addresses stored in the address storage unit.

18 Claims, 11 Drawing Sheets

ADDRESS DETECTION CIRCUIT, MEMORY SYSTEM INCLUDING THE SAME

CROSS-REFERENCE TO RELATED APPLICATIONS

The present application claims priority of Korean Patent Application No. 10-2013-0060475, filed on May 28, 2013, which is incorporated herein by reference in its entirety.

BACKGROUND

1. Field

Exemplary embodiments of the present invention relate to an integrated circuit design technology, and more particularly, to an address detection circuit, a memory system, and an address detection method.

2. Description of the Related Art

As the degree of integration of a memory increases, a space between word lines included in the memory such as a DRAM is reduced. As the space between the word lines is reduced a coupling effect between adjacent word lines may increase.

When data is inputted or outputted to or from a memory cell, a word line toggles between an activated state and a deactivated state. In this regard, the coupling effect between adjacent word lines may increase and the data of a memory cell connected with a word line adjacent to a frequently activated word line may be degraded. Such a phenomenon is called word line disturbance or word line hammer. Due to the word line disturbance, the data of a memory cell may be degraded within an expected retention time of the memory cell to be refreshed.

FIG. 1 is a diagram illustrating a part of a cell array included in a DRAM describing the word line disturbance.

In FIG. 1, 'WLL' corresponds to a frequently activated word line (i.e., a word line having a large number of activation times), and 'WLL−1' and 'WLL+1' correspond to adjacent word lines, which are disposed adjacent to the frequently activated word line WLL. Furthermore, 'CL' denotes a memory cell connected to the frequently activated word line WLL, 'CL−1' denotes a memory cell connected to the word line frequently activated WLL−1, and 'CL+1' denotes a memory cell connected to the adjacent word line WLL+1. The memory cells CL, CL−1 and CL+1 include cell transistors TL, TL−1 and TL+1 and cell capacitors CAPL, CAPL−1 and CAPL+1, respectively. For reference, 'BL' and 'BL+1' denote bit lines.

When the word line WLL is activated or deactivated, the voltages of the adjacent word lines WLL−1 and WLL+1 are increased or decreased due to a coupling phenomenon occurring among the word lines WLL, WLL−1 and WLL+1. Accordingly, the amount of charges charged in the cell capacitors CAPL−1 and CAPL+1 is affected, so that the data of the memory cells 'CL−1' and the 'CL+1' may be degraded.

Furthermore, as electromagnetic waves, which are generated while the word line toggles between the activated state and the deactivated state, introduce or discharge electrons into or from the cell capacitors of the memory cells connected with adjacent word lines, data are likely to be degraded.

In order to prevent degradation of data due to the word line disturbance, it may be necessary to provide a scheme for detecting the frequently activated word lines and a scheme for storing the count information.

SUMMARY

Various embodiments of the present invention are directed to an address detection circuit that may store addresses inputted for a predetermined period and detect an address with a high input frequency by using the stored addresses.

Other embodiments of the present invention are directed to an address detection circuit that may detect an address with an input frequency or the number of input times satisfying a predetermined condition.

Further, other embodiments of the present invention are directed to a memory system that may prevent data from being degraded due to word line disturbance, by using address detection.

In an embodiment according to the present invention, an address detection circuit may include an address storage unit suitable for receiving an address when an active command is activated, and storing recently inputted N number of addresses, and an address determination unit suitable for determining whether an address currently inputted to the address storage unit is already inputted at least a threshold number of times in each period that the active command is activated M (1≤M≤N) number of times, based on the N number of addresses stored in the address storage unit. In an embodiment according to the present invention, an address detection circuit may include a first detection block suitable for receiving an address when an active command is activated, storing recently inputted N number of addresses, and activating a first detection signal when a currently inputted address is already inputted at least a first threshold number of times in each period that the active command is activated M (1≤M≤N) number of times, based on the stored N number of addresses, and a second detection block suitable for setting the currently inputted address as a detection target address when the first detection signal is activated, counting the number of times by which the detection target address and the currently inputted address are the same with each other when the first detection signal is activated, and activating a second detection signal when a counting result is at least a second threshold number of times.

The first detection block may delete an earliest stored address among the stored N number of addresses when an address is inputted, and stores the inputted address.

The first detection block may include first to Nth storage sections each of which suitable for storing an address, and the first to Nth storage sections are connected in series, and a Kth (2≤K≤N−1) storage section outputs a value stored therein to a K+1th storage section and stores a value outputted from a K−1th storage section.

The first detection block may include first to Nth comparing sections suitable for comparing addresses stored in corresponding storage sections among the first to Nth storage sections with a currently inputted address, and a detection signal generating section suitable for activating a detection signal when the number of address, which is the same as a currently inputted address, among each M number of addresses stored in first to Lth (N=M×L) groups, is equal to or greater than the threshold number of times, based on comparison results of the first to Nth comparing sections, wherein first to Lth groups include M number of storage sections among the first to Nth storage sections.

The first detection block may be initialized when an address inputted the at least threshold number of times in each period that the active command is activated the M (1≤M≤N) number of times is detected.

When a currently inputted address and the detection target address are different from each other when the first detection signal is activated, the second detection block may change the detection target address to the currently inputted address and initializes the counting result.

In an embodiment according to the present invention, a memory system may include a memory including a cell array, wherein the cell array includes a plurality of memory cells connected to each of first to $N^{th}$ word lines and a detection block which is suitable for receiving an address corresponding to one of the first to $N^{th}$ word lines when an active command is inputted, storing recently inputted N number of addresses and detecting a high input frequency address having been inputted at least a threshold number of times in each period that the active command is activated M (1≤M≤N) number of times, based on the stored N number of addresses, and a memory controller suitable for applying at least one address including the high input frequency address and at least one adjacent address with a value adjacent to the high input frequency address to the memory in a special mode.

The detection block may delete an earliest stored address among the stored N number of addresses when an address is inputted, and stores the inputted address.

The memory controller may store the high input frequency address when a detection signal is activated, and causes the memory to enter the special mode.

The detection block may include an address storage unit suitable for receiving an address when an active command is activated, and storing recently inputted N number of addresses, and an address determination unit suitable for determining whether an address currently inputted to the address storage unit is already inputted at least a threshold number of times in each period that the active command is activated M (1≤M≤N) number of times, based on the N number of addresses stored in the address storage unit.

The detection block may include a first detection block suitable for receiving an address when an active command is activated, storing recently inputted N number of addresses, and activating a first detection signal when a currently inputted address is already inputted at least a first threshold number of times in each period that the active command is activated M (1≤M≤N) number of times, based on the stored N number of addresses, and a second detection block suitable for setting the currently inputted address as a detection target address when the first detection signal is activated, counting the number of times by which the detection target address and the currently inputted address are the same with each other, when the first detection signal is activated, and activating a second detection signal when a counting result is at least a second threshold number of times.

In an embodiment according to the present invention, an address detection circuit may include a first detection block suitable for receiving an address when an active command is activated, storing recently inputted N number of addresses, and activating a first detection signal when a currently inputted address is already inputted at least a first threshold number of times in each period that the active command is activated M (1≤M≤N) number of times, based on the stored N number of addresses, a second detection block suitable for receiving an address when the first detection signal is activated, storing recently inputted X number of addresses, and activating a second detection signal when a currently inputted address is already inputted at least a second threshold number of times in each period that the first detection signal is activated Y (1≤Y≤X) number of times, based on the stored X number of addresses.

The first detection block may delete an earliest stored address among the stored N number of addresses when an address is inputted, and stores the inputted address, and the second detection block may delete an earliest stored address among the stored X number of addresses when an address is inputted, and stores the inputted address.

The first detection block may include first to Nth storage sections each of which suitable for storing one of inputted N number of addresses, the first to Nth storage sections are connected in series, and a Kth (2≤K≤N−1) storage section outputs a value stored therein to a K+1th storage section and stores a value outputted from a K−1th storage section, and the second detection block may include first to Xth storage sections each of which suitable for storing one of inputted X number of addresses, the first to Xth storage sections are connected in series, and a Kth (2≤K≤X−1) storage section outputs a value stored therein to a K+1th storage section and stores a value outputted from a K−1th storage section.

The first detection block may include first to Nth comparing sections suitable for comparing addresses stored in corresponding storage sections among the first to Nth storage sections with a currently inputted address; and a first detection signal generating section suitable for activating a first detection signal when the number of addresses, which is the same as a currently inputted address, among each M number of addresses stored in first to Lth (N=M×L) groups, is equal to or greater than a first threshold number corresponding to the first threshold number of times, based on comparison results of the first to Nth comparing sections, wherein first to Lth groups include M number of storage sections among the first to Nth storage sections.

The second detection block may include first to Xth comparing sections suitable for comparing addresses stored in corresponding storage sections among the first to Xth storage sections with a currently inputted address; and a second detection signal generating section suitable for activating a second detection signal when the number of address, which is the same as a currently inputted address, among each Y number of addresses stored in first to Zth (X=Y×Z) groups, is equal to or greater than a first threshold number corresponding to the first threshold number of times, based on comparison results of the first to Xth comparing sections, wherein first to Zth groups include M number of storage sections among the first to Xth storage sections.

The first detection block may be initialized when an address, which is inputted at least the first threshold number of times in each period that the active command is activated the M (1≤M≤N) number of times, is detected, and the second detection block may be initialized when an address, which is inputted at least the second threshold number of times in each period that the active command is activated the Y (1≤Y≤X) number of times, is detected.

In an embodiment according to the present invention, an address detection circuit may include first to $N^{th}$ storage sections connected in series and suitable for shifting values stored therein when a shifting signal is activated, first to $N^{th}$ comparing sections suitable for comparing values stored in corresponding storage sections among the first to $N^{th}$ storage sections with an address inputted to the first storage section, and a detection signal generating section suitable for activating a detection signal when at least one detection address the same as the inputted address is detected among addresses stored in the first to $N^{th}$ storage sections, based on comparison results of the first to $N^{th}$ comparing sections.

The first storage section may store an inputted address when the shifting signal is activated.

The first to Nth storage sections may be divided into first to Lth (N=M×L) groups each including M number of storage sections among the first to Nth storage sections, and the detection signal generating section may activate the detection signal when an address, among addresses stored in the respective first to Lth groups, the same as the inputted address is detected.

When the detection signal is activated, the first to Nth storage sections may be initialized.

In an embodiment according to the present invention, an address detection circuit may include first to $N^{th}$ storage sections connected in series, and first to $N^{th}$ comparing sections suitable for comparing values stored in corresponding storage sections among the first to $N^{th}$ storage sections with an address inputted to the first storage section, wherein based on comparison results of the first to $N^{th}$ comparing sections, when an address the same as the address inputted to the first storage section is detected among addresses stored in the first to $N^{th}$ storage sections, the first to $N^{th}$ storage sections activate a detection signal, and, when an address the same as the address inputted to the first storage section is not detected, the first to $N^{th}$ storage sections shift values stored therein and the first storage section stores the address inputted thereto.

In an embodiment according to the present invention, an address detection circuit may include a first detection block suitable for storing one or more first addresses, activating a first detection signal en a first address the same as an inputted address is detected among the one or more first addresses and storing the inputted address when a first address the same as the inputted address is not detected, and a second detection block suitable for storing one or more second addresses, receiving the first detection address the same as the inputted address when the first detection signal is activated, activating a second detection signal when a second address the same as the inputted address is detected among the one or more second addresses, and storing the inputted first detection address when a second address the same as the inputted address is not detected.

In an embodiment according to the present invention, a memory system may include a memory including a cell array, wherein the cell array includes one or more memory cells connected to each of a plurality of word lines and a detection block suitable for detecting an address the same as an address inputted together with an active command among one or more addresses stored therein, as a high input frequency address, and storing an inputted address when the high input frequency address is not detected, and a memory controller suitable for applying at least one address including the high input frequency address, to the memory in a special mode.

When the high input frequency address is detected, the memory may output the high input frequency address to the memory controller.

When the high input frequency address is detected, the detection block may delete an address the same as the inputted address among the one or more stored addresses.

The memory may activate at least one word line adjacent to a word line corresponding to the high input frequency address among the plurality of word lines in the special mode.

In an embodiment according to the present invention, an address detection method may include receiving an input of an address, detecting a first address the same as an inputted address among one or more stored first addresses, and outputting the first address the same as the inputted address when the first address the same as the inputted address is detected, and storing the inputted address when the first address the same as the inputted address is not detected.

When the first address the same as the inputted address is detected, a first address the same as the inputted address may be deleted among the one or more stored first addresses.

The address detection method may further include receiving an input of the first address the same as the inputted address when the first address the same as the inputted address is detected, detecting a second address the same as the inputted first address among one or more stored second addresses, outputting the second address the same as the inputted first address when the second address the same as the inputted first address is detected; and storing the inputted first address when the second address the same as the inputted first address is not detected.

When the second address the same as the inputted first address is detected, a second address the same as the inputted first address may be deleted among the one or more stored second addresses.

In accordance with the above embodiments, by storing recently inputted addresses and comparing the stored addresses with a currently inputted address, it may possible to detect an address with a high input frequency.

Also, described in the embodiments, it may be possible to provide an address detection circuit that may detect an address with an input frequency or the number of input times satisfying a predetermined condition, by using addresses, which are stored according to a predetermined condition and histories with which addresses are stored, and a memory system.

Further described in the embodiments is that by refreshing adjacent word lines of a word liner with a high activation frequency (i.e., a frequently activated word line), by using a detected address, it may be possible to prevent data from being degraded due to word line disturbance.

DETAILED DESCRIPTION

Figure 1:
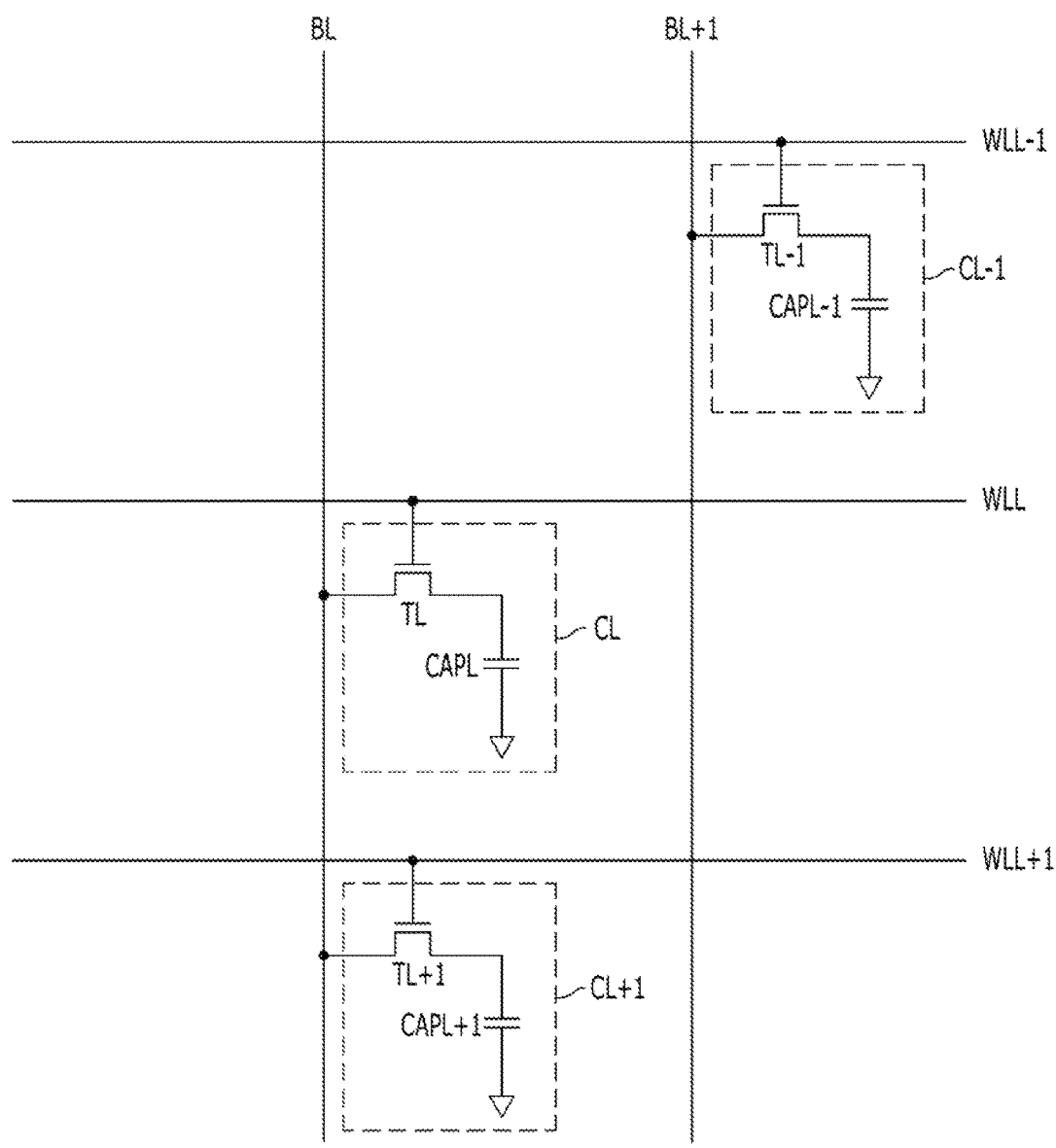
FIG. 1 is a diagram illustrating a part of a cell array included in a DRAM describing word line disturbance.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected coupled" refers to one component not only directly coupling another component but also indirectly coupling another component through an intermediate component. In addition, a singular form may include a plural form as long as it is not specifically mentioned in a sentence.

In the following descriptions, a high input frequency address means an address, which is inputted with a certain frequency satisfying a condition preset by a designer. In the address detection circuit of FIG. 3, a high input frequency address may be set to an address, which is inputted at least a threshold number of times in each period that an active command ACT is activated M ($1 \leq M \leq N$) number of times. The number M and the threshold number of times may be changed according to a design. In the address detection circuit of FIG. 5, a high input frequency address may be set to an address of which input through at least a first threshold number of times in each period that an active command ACT is activated M ($1 \leq M \leq N$) number of times and occurs consecutively at least a second threshold number of times.

Figure 2:
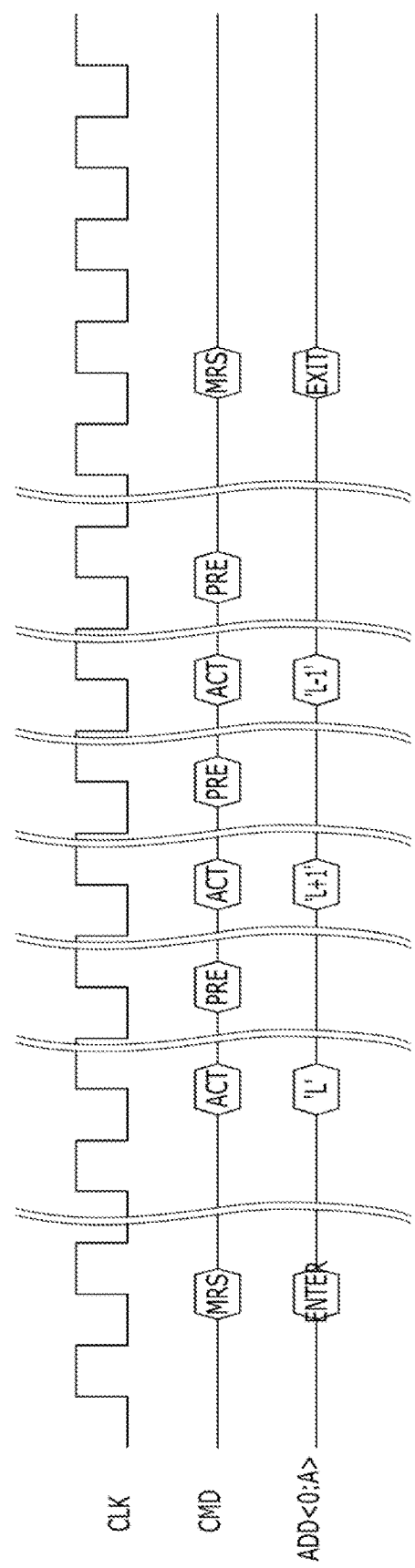
FIG. 2 is a timing diagram for explaining a special refresh operation in a memory system.

FIG. 2 is a timing diagram describing a special refresh operation in a memory system. The special refresh operation is used to substantially prevent the data of memory cells connected with word lines adjacent to a word line having a number of activation times satisfying a reference number of times, from being degraded due to word line disturbance.

A memory (not shown in FIG. 2) includes first to $N^{th}$ word lines (N is a natural number). The memory receives various signals, such as command signals CMD, addresses ADD<0:A> and data (not shown in FIG. 2). Hereinafter, the value of an address corresponding to an $L^{th}$ word line (L is a natural number satisfying $1 \leq L \leq N$) among the first to $N^{th}$ word lines will be denoted by 'L'.

Frequencies with which the first to $N^{th}$ word lines are already activated are the same as frequencies with which addresses corresponding to the first to $N^{th}$ word lines are inputted together with an active command to the memory. Thus, the memory determines whether the frequencies with which the addresses corresponding to the first to $N^{th}$ word lines are inputted together with the active command to the memory, satisfy a predetermined condition. A standard for determining a high input frequency address may be changed according to a design.

When a specific address combination is inputted together with a mode register set command MRS to the memory, the memory enters a special mode by the mode resistor setting (i.e., 'ENTER' setting). Furthermore, when a specific address combination is inputted together with the mode register set command MRS, the memory exits the special mode (i.e., 'EXIT' setting). Compensating for data degradation by entering the special mode through the mode register set command MRS and the specific address combination is for an illustrative purpose only. For example, it may be possible to control the memory to perform the compensating operation using a newly defined signal or an existing signal combination according to a design.

In the special mode, the memory operates by the unit of a 'compensation cycle' including an operation of activating word lines, which are adjacent to a word line corresponding to a high input frequency address. Hereinafter, descriptions will be made for the case in which the address L corresponding to the $L^{th}$ word line is the high input frequency address.

In each compensation cycle, a first active command ACT and the high input frequency address L are inputted to the memory. After a predetermined time has passed, a precharge command PRE is inputted to the memory. The memory activates the $L^{th}$ word line in response to the active command ACT and the address L, and deactivates the activated $L^{th}$ word line in response to the precharge command PRE.

Then, addresses L+1 and L−1 corresponding to word lines adjacent to the $L^{th}$ word line are sequentially inputted together with the active command ACT after the first. In FIG. 2, a second active command ACT and the address L+1 are inputted, and a third active command ACT and the address L−1 are inputted. Accordingly, an L+1$^{th}$ word line and an L−1$^{th}$ word line of the memory are sequentially activated. For reference, the input order of the address L+1 and the address L−1 may be changed.

When the operation of activating the word lines adjacent to the $L^{th}$ word line is completed, the memory exits the special mode by the combination of the mode register set command MRS and an address inputted from a memory controller (not shown in FIG. 2).

When a certain word line is activated, the data of the memory cells connected with the word line are refreshed. Therefore, in the special mode, by activating the word lines adjacent to the word line corresponding to the high input frequency address, it may be possible to substantially prevent data degradation from occurring due to word line disturbance. Below, descriptions will be made for an address detection circuit for detecting a high input frequency address and a memory system capable of preventing word line disturbance using the high input frequency address.

Figure 3:
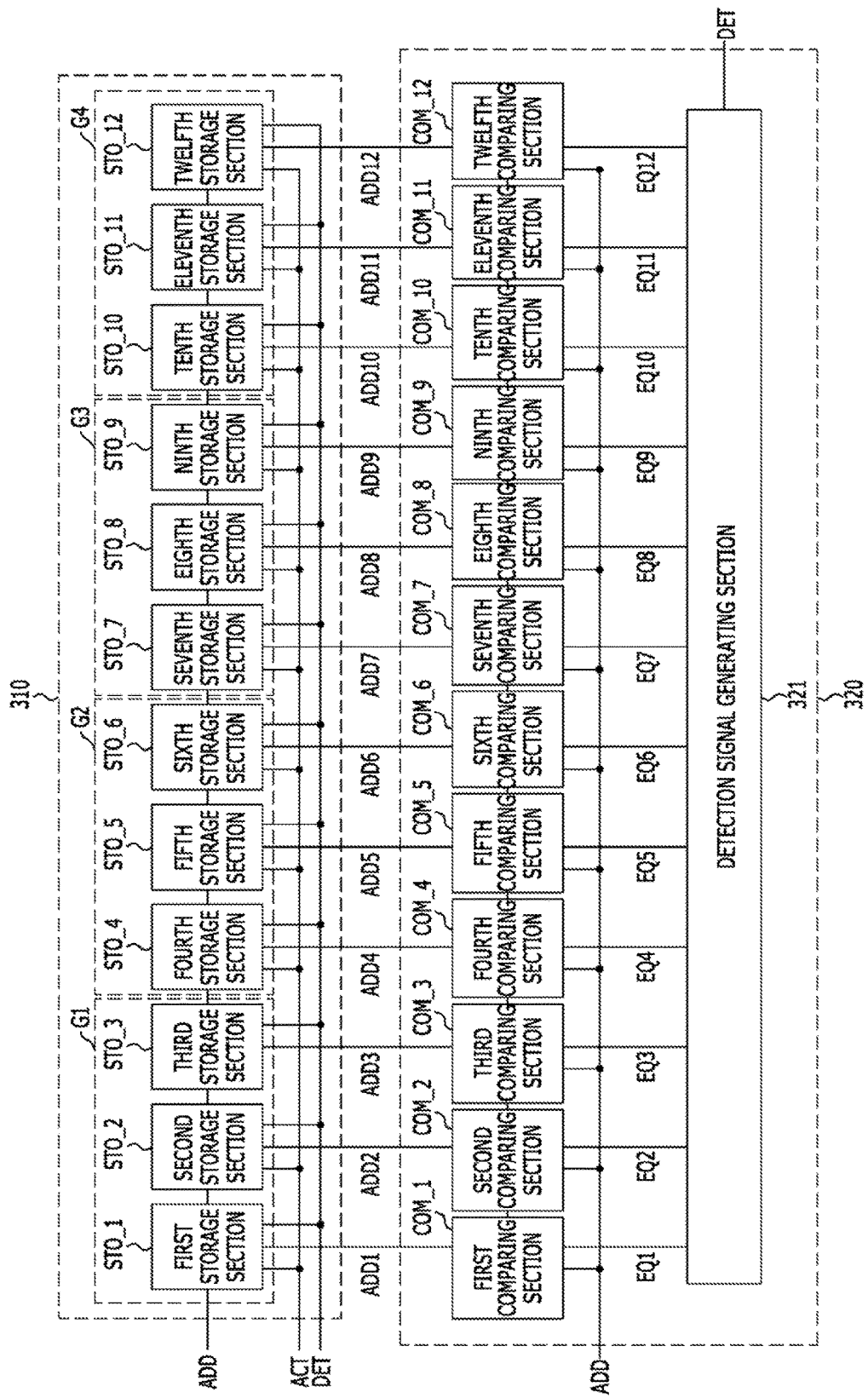
FIG. 3 is a block diagram illustrating an address detection circuit in accordance with an embodiment of the present invention.

FIG. 3 is a block diagram of an address detection circuit in accordance with an embodiment of the present invention.

Referring to FIG. 3, the address detection circuit includes an address storage unit 310 suitable for being inputted with an address ADD whenever an active command ACT is activated and storing recently inputted N number of addresses, and an address determination unit 320 suitable for determining whether an address currently inputted to the address storage unit 310 is already inputted at least a threshold number of times in each period that the active command ACT is activated M ($1 \leq M \leq N$) number of times, based on the N number of addresses stored in the address storage unit 310. While FIG. 3 shows the case where N=12 it is noted that N may be changed according to a design.

The address detection circuit be described below in detail with reference to FIG. 3.

The address storage unit 310 is applied with the active command ACT and an address ADD. The address storage unit 310 stores an address ADD, which is applied whenever the active command ACT is activated. The address storage unit 310 stores recently inputted N number of addresses. When an address ADD is inputted, the address storage unit 310 deletes an earliest stored address among the stored N number of addresses, and stores the currently inputted address ADD. That is to say, the address storage unit 310 updates the earliest stored address among the stored N number of addresses, with the currently inputted address ADD.

For this operation, the address storage unit 310 includes first to $N^{th}$ storage sections STO_1 to STO_N each suitable for storing one of recently inputted N number of addresses. The first to $N^{th}$ storage sections STO_1 to STO_N are connected in series. A $K^{th}$ (2≤K≤N-1) storage section STO_K outputs the value stored therein to a $K+1^{th}$ storage section STO_K+1 and stores the value outputted from a $K-1^{th}$ storage section STO_K-1. The first storage section STO_1 stores the address inputted to the address storage unit 310, and when the address outputted from the $N-1^{th}$ storage section STO_N-1 is inputted to the $N^{th}$ storage section STO_N, the value stored in the $N^{th}$ storage section STO_N is deleted. The values stored in the first to $N^{th}$ storage sections STO_1 to STO_N may be shifted whenever an address ADD is inputted to the address storage unit 310. Since addresses are sequentially stored in the first to $N^{th}$ storage sections STO_1 to STO_N when an address is inputted and since a currently inputted address is stored and an earliest stored address is deleted, the address storage unit 310 always stores recently inputted N number of addresses.

The address storage unit 310 is initialized when a high input frequency address is detected. If the address storage unit 310 is initialized, the addresses stored in the first to $N^{th}$ storage sections STO_1 to STO_N are all deleted, and as addresses are subsequently inputted, addresses are sequentially stored in the first to $N^{th}$ storage sections STO_1 to STO_N.

The address determination unit 320 detects a high input frequency address based on the N number of addresses stored in the address storage unit 310. In detail, the address determination unit 320 compares an address ADD currently inputted to the address storage unit 310 with N number of addresses ADD1 to ADDN stored in the address storage unit 310, and detects a high input frequency address, which is inputted at least the threshold number of times in each period that the active command ACT is activated the M (1≤M≤N) number of times, by using comparison results.

For this operation, the address determination unit 320 includes first to $N^{th}$ comparing sections COM_1 to COM_N and a detection signal generating section 321. The first to $N^{th}$ comparing sections COM_1 to COM_N compare the addresses stored in storage sections corresponding to them among the first to $N^{th}$ storage sections STO_1 to STO_N with a currently inputted address ADD. The a detection signal generating section 321 activates a detection signal DET when an address, which is the same as a currently inputted address ADD, among each M number of addresses stored in first to $L^{th}$ (L satisfies the condition that N=M×L) groups G1 to GL, is equal to or greater than the threshold number of times, based on comparison results of the first to $N^{th}$ comparing sections COM_1 to COM_N. Each first to $L^{th}$ groups G1 to GL include M number of storage sections among the first to $N^{th}$ storage sections STO_1 to STO_N.

The first to $N^{th}$ comparing sections COM_1 to COM_N output the results of comparing the addresses stored in the storage sections corresponding to them among the first to $N^{th}$ storage sections STO_1 to STO_N with the currently inputted address ADD. A $K^{th}$ (1≤K≤N) comparing section COM_K compares an address ADDK stored in the $K^{th}$ storage section STO_K with the currently inputted address ADD, and activates a $K^{th}$ comparison signal EQK when they are the same with each other and deactivates the $K^{th}$ comparison signal EQK when they are not the same with each other.

The detection signal generating section 321 determines whether the currently inputted address ADD is a high input frequency address, based on first to $N^{th}$ comparison signals EQ1 to EQN. When the currently inputted address ADD is a high input frequency address, the detection signal generating section 321 activates the detection signal DET. The first to $N^{th}$ storage sections STO_1 to STO_N are divided into the first to $L^{th}$ groups G1 to GL each including M number of storage sections. The detection signal generating section 321 determines whether the number of addresses the same as the currently inputted address ADD among the M number of addresses stored in each of the first to $L^{th}$ groups G1 to GL is at least the threshold number of times, based on M number of comparison signals corresponding to each of the first to $L^{th}$ groups G1 to GL. When the number of addresses the same as the currently inputted address ADD is at least the threshold number in each of all the first to $L^{th}$ groups G1 to GL, the currently inputted address ADD corresponds to a high input frequency address, which is inputted at least the threshold number of times in each period that the active command ACT is activated the M (1≤M≤N) number of times.

Figure 4:
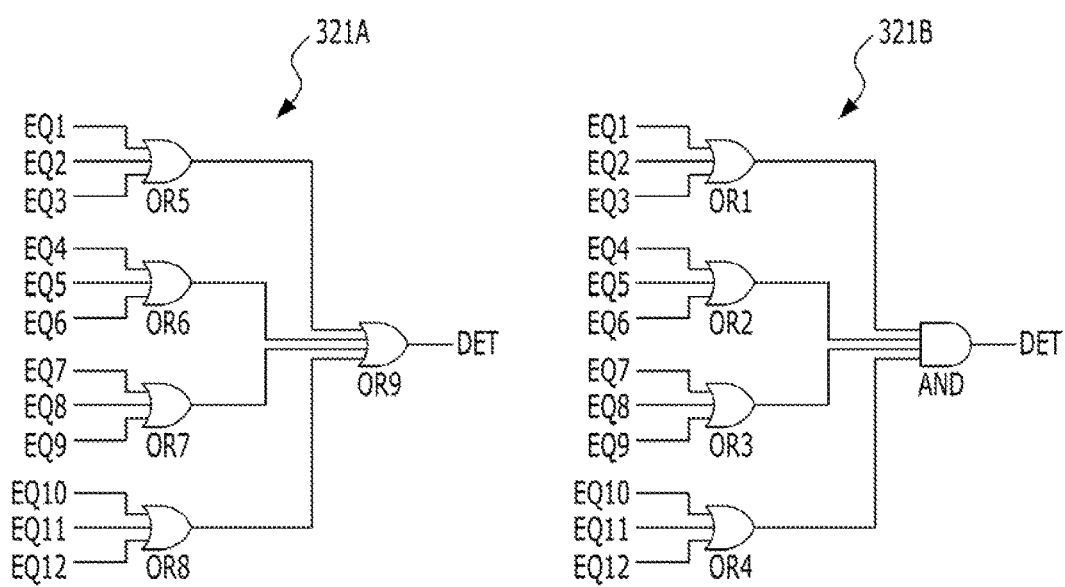
FIG. 4 is detailed diagram illustrating various examples of a detection signal generating section shown in FIG. 3.

FIG. 4 illustrates detailed diagram of the detection signal generating section 321 shown in FIG. 3. A first configuration 321A corresponds to the case where M=N and the threshold number of times is one. That is to say, when a currently inputted address ADD is already inputted at least one time while addresses are inputted recently N number of times, the detection signal DET is activated. A second configuration 321B corresponds to the case where M=3 and the threshold number of times is one. That is to say, when a currently inputted address ADD is already inputted at least one time whenever addresses are inputted three times while addresses are inputted recently N number of times, the detection signal DET is activated. In this way, a condition of a high input frequency address may be changed according to a design.

Entire operations of the address detection circuit will be described below. The following explanations will be made for the case where N=12 M=3 and the threshold number of times is '1', that is, the case where an address inputted at least one time whenever addresses are inputted three times while addresses are inputted recently twelve times is set to a high input frequency address.

From an initialized state, that is, from the state in which no addresses are stored in the first to twelfth storage sections STO_1 to STO_12 the address storage unit 310 stores an address ADD, which is inputted whenever the active command ACT is activated. If addresses ADD are stored in all of the first to twelfth storage sections STO_1 to STO_12, whenever an address ADD is inputted, the inputted address ADD is stored in the first storage section STO_1, the values stored in the first to eleventh storage sections STO_1 to STO_11 are shifted, and the value stored in the twelfth storage section STO_12 is deleted. The first to twelfth storage sections STO_1 to STO_12 are divided into first to fourth groups G1 to G4. The first group G1 includes the first to third storage sections STO_1 to STO_3, the second group G2 includes the fourth to sixth storage sections STO_4 to STO_6, the third group G3 includes the seventh to ninth storage sections STO_7 to STO_9, and the fourth group G4 includes the tenth to twelfth storage sections STO_10 to STO_12.

The first to twelfth comparing sections COM_1 to COM_12 included in the address determination unit 320 compare the addresses ADD1 to ADD12 respectively stored in the first to twelfth storage sections STO_1 to STO_12 with the currently inputted address ADD, and generate the first to twelfth comparison signals EQ1 to EQ12. The detection signal generating section 321 activates the detection signal DET when at least one address the same as the currently inputted address ADD is present in each of all the first to fourth groups G1 to G4, based on the first to twelfth comparison signals EQ1 to EQ12. To this end, the detection signal generating section 321 may include a plurality of logic gates OR1 to OR4 and AND. The address detection circuit described above may detect an address, which is already inputted at least one time whenever addresses are inputted three times while addresses are inputted recently twelve times.

The first configuration 321A corresponds to the case where M=N and the threshold number of times is '1'. For example, when N=12, the detection signal DET is activated when a currently inputted address ADD is already inputted at least one time while addresses ADD are inputted recently 12 times. For this operation, the detection signal generating section 321 includes a plurality of gates OR5 to OR9. The detection signal generating section 321 activates the detection signal DET when at least one comparison signal among the first to twelfth comparison signals EQ1 to EQ12 is activated.

While it was described in the above example that the number of conditions for detecting a high input frequency address is '1', it is to be noted that a high input frequency address may be detected when one of at least two conditions is satisfied or at least two conditions are all satisfied. In this case, only the configuration of the detection signal generating section 321 may be changed in conformity with the condition or conditions.

The address detection circuit in accordance with the embodiment may detect a high input frequency address, which satisfies a predetermined condition. The high input frequency address may be used to solve concerns, which are caused due to word line disturbance.

Figure 5:
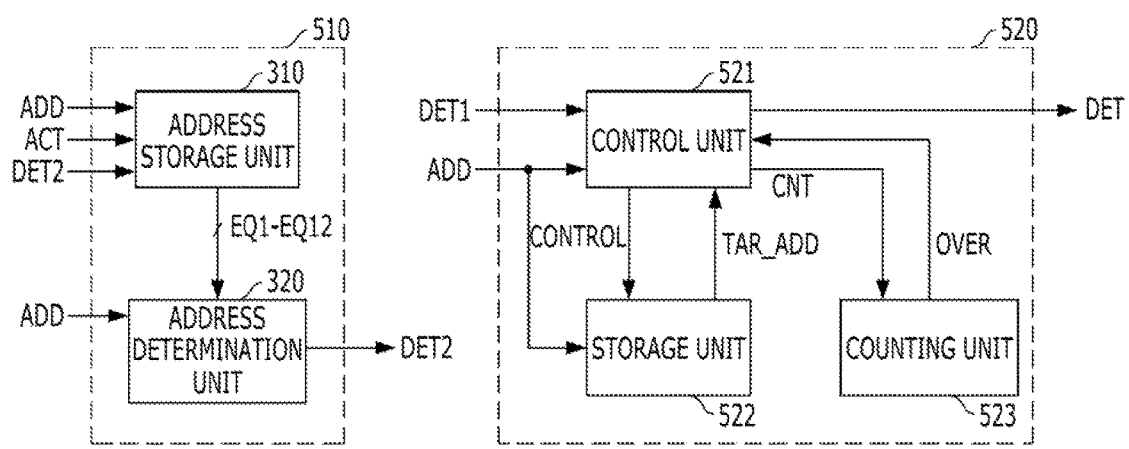
FIG. 5 is a block diagram illustrating an address detection circuit in accordance with another embodiment of the present invention.

FIG. 5 is a block diagram illustrating an address detection circuit in accordance with another embodiment according to the present invention. The address detection circuit of FIG. 5 may include the address detection circuit of FIG. 3.

Referring to FIG. 5, an address detection circuit includes a first detection block 510 suitable for being inputted with an address ADD whenever an active command ACT is activated, storing recently inputted N number of addresses, and activating a first detection signal DET1 when a currently inputted address ADD is already inputted at least a first threshold number of times in each period that the active command ACT is activated M ($1 \leq M \leq N$) number of times, based on the stored N number of addresses, and a second detection block 520 suitable for setting the currently inputted address ADD as a detection target address TAR_ADD when the first detection signal DET1 is activated, counting the number of times by which the detection target address TAR_ADD and the currently inputted address ADD are the same with each other, whenever the first detection signal DET1 is activated, and activating a second detection signal DET2 when a counting result is at least a second threshold number of times.

The address detection circuit will be described below in detail with reference to FIGS. 3 to 5.

The first detection block 510 may be the same as the address detection circuit of FIG. 3. In the same manner as described above with reference to FIG. 3 the first detection block 510 activates the first detection signal DET1 by detecting whether a currently inputted address ADD is already inputted at least the first threshold number of times in each period that the active command ACT is activated the M ($1 \leq M \leq N$) number of times.

The second detection block 520 stores the address ADD inputted to the first detection block 510 when the first detection signal in DET1 is activated, and sets the address ADD inputted to the first detection block 510 as the detection target address TAR_ADD. The second detection block 520 compares an address ADD inputted to the first detection block 510 with the detection target address TAR_ADD whenever the first detection signal DET1 is activated. The second detection block 520 counts the number of times when the address ADD inputted to the first detection block 510 and the detection target address TAR_ADD are same as each other. When the address ADD inputted to the first detection block 510 and the detection target address TAR_ADD are different from each other, the second detection block 520 stores the address ADD inputted to the first detection block 510, and sets the address ADD inputted to the first detection block 510, as the detection target address TAR_ADD.

The second detection block 520 counts the number of times when the address ADD inputted to the first detection block 510 and the detection target address TAR_ADD are the same with each other, whenever the first detection signal DET1 is activated. When a counting result is at least the second threshold number of times, the second detection block 520 activates the second detection signal DET2. Accordingly, the high input frequency address detected by the address detection circuit of FIG. 5 is an address of which input through at least the first threshold number of times in each period that the active command ACT is activated the M ($1 \leq M \leq N$) number of times and occurs at least the second threshold number of times.

For this operation, the second detection block 520 may include a control unit 521, a storage unit 522, and a counting unit 523. The control unit 521 is suitable for storing an address ADD inputted to the first detection block 510, in the storage unit 522 when the first detection signal DET1 is activated. The address stored in the storage unit 522 is set as the detection target address TAR_ADD. Thereafter, the control unit 521 compares an address ADD inputted to the first detection block 510, with the detection target address TAR_ADD, when the first detection signal DET1 is activated. The control unit 510 activates a counting signal CNT when the two addresses are the same with each other, and stores the address ADD inputted to the first detection block 510, in the storage unit 522 when the two addresses are different from each other. The counting unit 523 performs counting whenever the counting signal CNT is activated, and activates a flag signal OVER when a counting result is at least the second threshold number of times. The control unit 521 activates the second detection signal DET2 in response to the flag signal OVER, outputs the value stored in the storage unit 522 to an outside of the second detection block 520, and initializes the second detection block 520.

Entire operations of the address detection circuit will be described below. The following descriptions will be made for the case where N=12, M=the first threshold number of times is '1' and the second threshold number of times is 5, that is, the case where an address of which input through at least one time whenever addresses are inputted three times while addresses are inputted recently twelve times occurs consecutively at least five times is a high input frequency address.

A procedure in which the first detection signal DET1 is activated is the same as described above with reference to FIG. 3. The second detection block 520 sets a currently inputted address ADD as the detection target address TAR_ADD when the first detection signal DET1 is activated. Thereafter, the second detection block 520 compares a currently inputted address ADD with the detection target address TAR_ADD whenever the first detection signal DET1 is activated, and activates the second detection signal DET2 and outputs the detection target address TAR_ADD when the currently inputted address ADD and the detection target address TAR_ADD are the same with each other consecutively at least five times. When the detection target address TAR_ADD and a currently inputted address ADD are different from each other before the address ADD the same as the detection target address TAR_ADD is inputted at least five times, the second detection block 520 updates the detection target address TAR_ADD with the currently inputted address ADD and initializes the counting result of the counting unit 523.

While it was described with reference to FIG. 5 that only one detection target address TAR_ADD may be set, the number of detection target addresses TAR_ADD may be changed according to a design. The number of detection target addresses TAR_ADD may be increased by increasing the number of addresses to be stored in the storage unit 522 and increasing the number of counting units 523 for comparing these addresses with a currently inputted address ADD when the first detection signal DET1 is activated and counting the numbers of times when respective pairs of addresses are the same with each other. If the number of detection target addresses TAR_ADD is increased, high input frequency addresses may be detected by simultaneously setting an increased number of addresses as candidates to become high input frequency addresses.

The address detection circuit in accordance with the embodiment may detect a high input frequency address, which satisfies a predetermined condition. Various conditions may be set using the second detection block 520. The high input frequency address may be used to solve concerns, which are caused due to word line disturbance.

Figure 6:
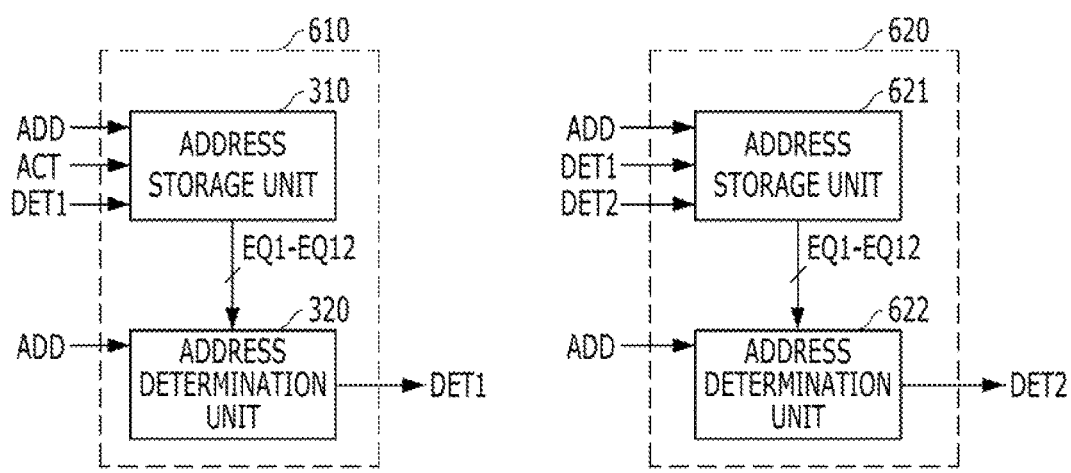
FIG. 6 is a block diagram illustrating an address detection circuit in accordance with another embodiment of the present invention.

FIG. 6 is a block diagram illustrating an address detection circuit in accordance with another embodiment according to the present invention. The address detection circuit of FIG. 6 may include two address detection circuits shown in FIG. 3, which are connected in series.

Referring to FIG. 6, an address detection circuit includes a first detection block 610 suitable for being inputted with an address ADD whenever an active command ACT is activated, storing recently inputted N number of addresses, and activating a first detection signal DET1 when a currently inputted address is already inputted at least a first threshold number of times in each period that the active command ACT is activated M ($1 \leq M \leq N$) number of times, based on the stored N number of addresses, and a second detection block 620 suitable for being inputted with an address ADD whenever the first detection signal DET1 is activated, storing recently inputted X number of addresses, and activating a second detection signal DET2 when a currently inputted address is already inputted at least a second threshold number of times in each period that the first detection signal DET1 is activated Y ($1 \leq Y \leq X$) number of times, based on the stored X number of addresses.

The address detection circuit be described below in detail with reference to FIGS. 3, 4 and 6.

The first detection block 610 may be the same as the address detection circuit of FIG. 3. In the same manner as described above with reference to FIG. 3, the first detection block 610 activates the first detection signal DET1 by detecting whether the currently inputted address ADD is already inputted at least the first threshold number of times in each period that the active command ACT is activated the M ($1 \leq M \leq N$) number of times.

The second detection block 620 is substantially the same as the address detection circuit of FIG. 3, except that the second detection block 620 activates the second detection signal DET2 by detecting whether the currently inputted address ADD is already inputted at least the second threshold number of times in each period that not the active command ACT but the first detection signal DET1 is activated the Y ($1 \leq Y \leq X$) number of times.

When compared to the first detection block 610, in the second detection block 620, the active command ACT is changed to the first detection signal DET1 not the N number of addresses but the X number of addresses are stored, and the second detection signal DET2 is activated when the currently inputted address ADD is already inputted not the at least first threshold number of times but the at least second threshold number of times whenever the first detection signal DET1 is activated not the M number of times but the V number of times. Namely, except these differences, the configuration and operations of the second detection block 620 are the same as the configuration and operations of the first detection block 610. The value of X may be equal to or different from N, and the value of Y may be equal to or different from M.

For the above-described operations, the second detection block 620 includes an address storage unit 621 suitable for storing the X number of addresses, and an address determination unit 622 suitable for comparing the X number of addresses stored in the address storage unit 621 with an address ADD and generating the second detection signal DET2. When an address ADD is inputted, the address storage unit 621 deletes an earliest stored address among the stored X number of addresses, and stores the inputted address ADD. The manner of storing an inputted address and deleting an earliest stored address is the same as described above with reference to FIG. 3.

The second detection block 620 includes first to $X^{th}$ storage sections (which respectively correspond to the storage sections STO_1 to STO_12 of FIG. 3 and the number of which is X) each suitable for storing one of inputted X number of addresses. The first to $X^{th}$ storage sections are connected in series. An $L^{th}$ ($2 \leq L \leq X-1$) storage section outputs the value stored therein to an $L+1^{th}$ storage section and stores the value outputted from an $L-1^{th}$ storage section.

The second detection block 620 includes first to $X^{th}$ comparing sections (which respectively correspond to the comparing sections COM_1 to COM_12 of FIG. 3 and the number of which is X) suitable for comparing the addresses stored in storage sections corresponding to them among the first to $X^{th}$ storage sections with a currently inputted address, and a detection signal generating section suitable for activating the second detection signal DET2 when the same address as the currently inputted address is present by a second threshold number corresponding to the second threshold number of times in respective Y numbers of addresses stored in first to $Z^{th}$ (Z satisfies the condition that $X = Y \times Z$) groups each including number of storage sections among the first to $X^{th}$ storage sections, based on comparison results of the first to $X^{th}$ comparing sections.

The second detection block 620 initializes stored addresses when an address inputted the at least second threshold number of times in each period that the first detection signal DET1 is activated the Y (1≤Y≤X) number of times is detected.

Entire operations of the address detection circuit will be described below. In the case where N=X=12 M=Y=3 and the first threshold number of times and the second threshold number of times are '1', the first detection block 610 activates the first detection signal DET1 when an address is already inputted at least one time whenever addresses are inputted three times while addresses are inputted recently twelve times, and the second detection block 620 activates the second detection signal DET2 in each period that the address is inputted at least one time whenever addresses are inputted three times while the first detection signal DET1 is activated (i.e., addresses are inputted) recently twelve times.

In this way, by using address detection circuits of FIG. 3 by connecting them in series, an input range of addresses to be considered may be widened, and a high input frequency address may be detected with a precise condition. While it was shown in FIG. 6 that an address is detected by connecting in series two address detection circuits of FIG. 3, it may be envisaged that an address may be detected by connecting in series at least three address detection circuits configured and operating similarly to FIG. 3, according to a design. In this case, an address input range that may be considered each time an address detection circuit is added by 1 stage is widened in the form of a multiplication.

Figure 7:
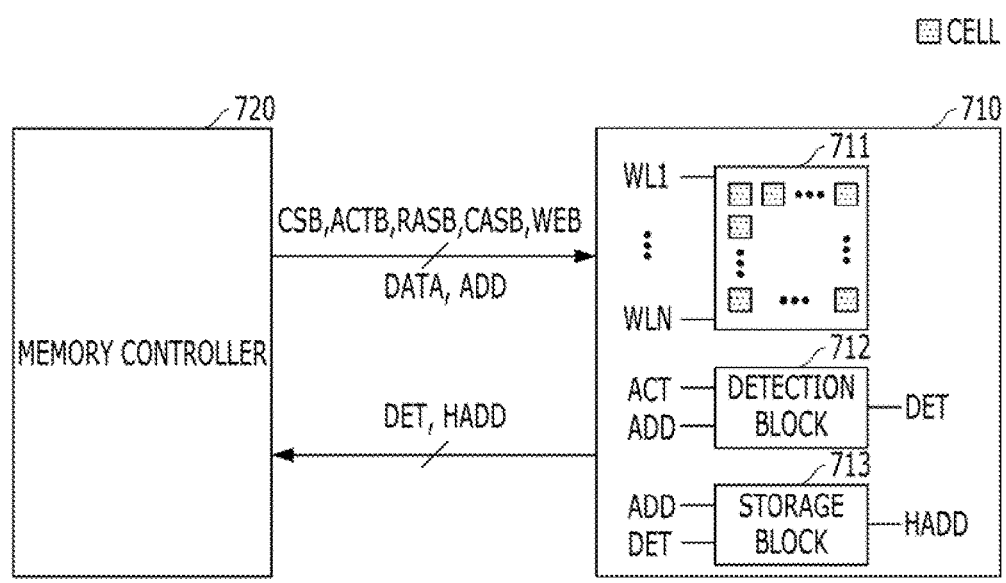
FIG. 7 is a block diagram illustrating a memory system in accordance with another embodiment of the present invention.

FIG. 7 is a block diagram illustrating a memory system in accordance with another embodiment of the present invention.

Referring to FIG. 7, a memory system includes a memory 710 including a cell array 711, which includes a plurality of memory cells CELLs connected to each of a plurality of word lines WL1 to WLN and a detection block 712, which is suitable for being inputted with an address corresponding to one of the plurality of word lines WL1 to WLN whenever an active command ACT is inputted, storing recently inputted N number of addresses, and detecting a high input frequency address HADD already inputted at least a threshold number of times in each period that the active command ACT is activated M (1≤M≤N) number of times, based on the stored N number of addresses, and a memory controller 720 suitable for applying at least one address including a high input frequency address HADD, to the memory 710 in a special mode. The at least one address may include a high input frequency address HADD and at least one adjacent address with a value adjacent to the high input frequency address. The at least one adjacent address may be the address of a word line adjacent to a word line corresponding to a high input frequency address HADD among the plurality of word lines WL1 to WLN. The adjacent value indicates an address with the value of '4' or '6' in the case where the value of a high input frequency address HADD is '5'. The memory 710 may include a storage block 713, which is suitable for storing an inputted address ADD when a detection signal DET is activated, and outputting the inputted address ADD as a high input frequency address HADD.

The detection block 712 included in the memory 710 of FIG. 7 may be one of the address detection circuit of FIG. 3, the address detection circuit of FIG. 5, and the address detection circuit of FIG. 6. In the case where the detection block 712 is the address detection circuit of FIG. 3, the high input frequency address HADD is an address, which is already inputted at least the threshold number of times in each period that the active command ACT is activated the M (1≤M≤N) number of times, and in the case where the detection block 712 is the address detection circuit of FIG. 5, the high input frequency address HADD is an address of which input through the at least first threshold number of times in each period that the active command ACT is activated the M (1≤M≤N) number of times and occurs consecutively the at least second threshold number of times. In the case where the detection block 712 is the address detection circuit of FIG. 6, the high input frequency address HADD is an address of which input through the at least first threshold number of times in each period that the active command ACT is activated the M (1≤M≤N) number of times and occurs the at least second threshold number of times in each period that the first detection signal DET1 is activated the Y (1≤Y≤X) number of times. Since the detailed operations of the detection block 712 are the same as described above with reference to FIGS. 3 to 6, descriptions thereof will be omitted herein.

For reference, the memory controller 720 inputs command signals including a chip select signal CSB, an active control signal ACTB, a row address strobe signal RASB, a column address strobe signal CASB and a write enable signal WEB, to the memory 710. The application of a specific command by the memory controller 720 to the memory 710 means that a combination of the above command signals CSB, ACTB, RASB, CASB and WEB corresponds to the specific command. For instance, the application of the active command ACT by the memory controller 720 to the memory 710 means that a combination of the command signals CSB, ACTB, RASB, CASB and WEB applied by the memory controller 720 to the memory 710 corresponds to the active command ACT. A command decoder (not shown) included in the memory 710 decodes the command signals CSB, ACTB, RASB, CASB and WEB and generates commands internally within memory 710. The memory controller 720 applies an address ADD, data DATA and so forth to the memory 710 in addition to the plurality of command signals CSB, ACTB, RASB, CASB and WEB, for operations of the memory 710.

In the following descriptions, a special mode represents an operation mode for activating a word line, which is adjacent to a high activation frequency word line (i.e., a word line corresponding to a high input frequency address or a frequently activated word line) and of which the activation frequency satisfies at least a preset condition, and thereby refreshing the data of a plurality of memory cells connected to the word line.

The memory system will be described below in detail with reference to FIG. 7.

In the memory 710, the command decoder decodes the plurality of command signals CSB, ACTB, RASB, CASB and WEB applied from the memory controller 720, and generates an active command for activating a word line, a precharge command for precharging a word line, a refresh command for refreshing memory cells, a read command for reading the data of memory cells, a write command for writing data to memory cells, and a mode register set command MRS for setting a mode register.

Not in a special mode but in a general operation mode, the memory 710 activates a word line corresponding to an inputted address ADD and accesses the memory cells, which are connected to the activated word line (i.e., performs a data reading operation or a data writing operation). The detection block 712 detects a high input frequency address HADD in response to the active command ACT and an address ADD, and activates the detection signal DET when a high input frequency address HADD is detected. The storage block 713 stores the address ADD when the detection signal DET is activated. The address ADD stored in the storage block 713 becomes a high input frequency address HADD. The memory 710 inputs a high input frequency address HADD to the memory controller 720.

When the detection signal DET is activated, the memory controller 720 may control the memory 710 to perform an operation under the special mode. The memory controller 720 may cause the memory to enter the special mode immediately when the detection signal DET is activated, or may cause the memory 710 to enter the special mode when a predetermined time has passed after the detection signal DET was activated. The memory 710 operates under the special mode from a time when it enters the special mode to a time when it exits the special mode.

When the detection signal DET is activated, the memory controller 720 causes the memory 710 to enter the special mode by a combination of the plurality of command signals CSB, ACTB, RASB, CASB and WEB and the address ADD. If the memory 710 enters the special mode, the memory controller 720 sequentially applies a high input frequency address L and addresses L+1 and L−1 corresponding to word fines adjacent to a word line corresponding to the high input frequency address L, together with the active command ACT. The memory 710 activates an $L^{th}$ word line WLL, an $L+1^{th}$ word line WLL+1 and an $L−1^{th}$ word line WLL−1 respectively corresponding to the addresses L, L+1 and L−1, in response to the active command ACT. If the operation under the special mode is completed, the memory controller 720 causes the memory 710 to exit the special mode by a combination of the plurality of command signals CSB, ACTB, RASB, CASB and WEB and the address ADD.

In the memory system in accordance with the embodiment, a predetermined condition is set, and an address satisfying such a condition is detected and stored as a high input frequency address and is inputted to the memory controller 720 so as to allow the memory 710 to operate in the special mode. Accordingly, by refreshing the memory cells connected to word lines adjacent to a high activation frequency word line, it may be possible to prevent data from being degraded due to word line disturbance.

An address detection circuit in accordance with another embodiment will be described with reference back to FIGS. 3 and 4.

Referring to FIG. 3 an address detection circuit includes first to $N^{th}$ storage sections STO_1 to STO_N connected in series and suitable for shifting the values stored therein whenever a shifting signal ACT is activated, first to $N^{th}$ comparing sections COM_1 to COM_N suitable for comparing the values stored in storage sections corresponding to them among the first to $N^{th}$ storage sections STO_1 to STO_N with an address ADD inputted to the first storage section STO_1 and a detection signal generating section 321 suitable for activating a detection signal DET when the same address as an address ADD inputted to the first storage section STO_1 is detected among the values stored in the first to $N^{th}$ storage sections STO_1 to STO_N, based on comparison results of the first to $N^{th}$ comparing sections COM_1 to COM_N.

Operations of the address detection circuit are the same as described above with reference to FIGS. 3 and 4.

Figure 8:
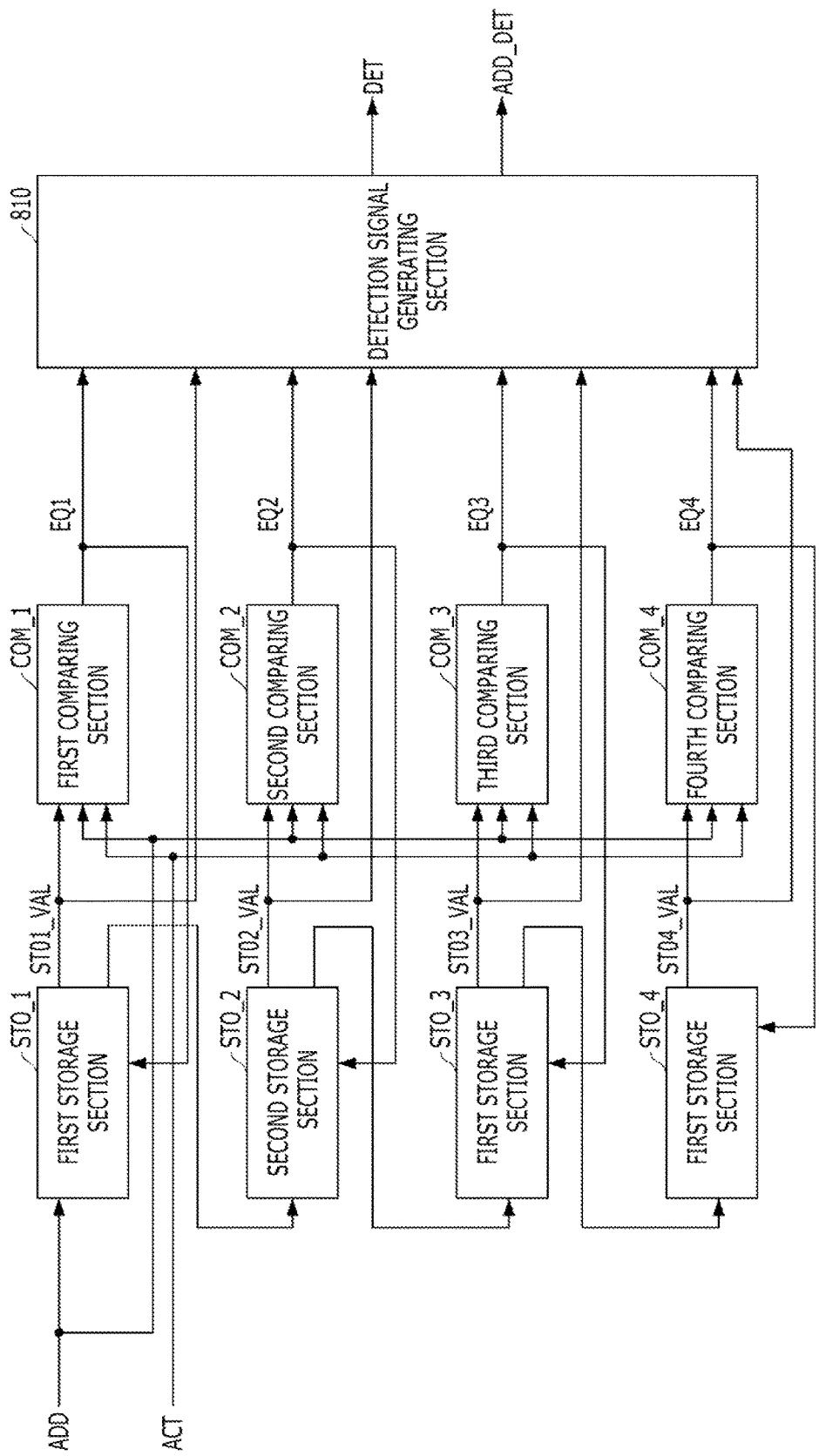
FIG. 8 is a block diagram illustrating an address detection circuit in accordance with another embodiment of the present invention.

FIG. 8 is a block diagram illustrating an address detection circuit in accordance with another embodiment of the present invention.

Referring to FIG. 8, an address detection circuit includes first to $N^{th}$ storage sections STO_1 to STO_N connected in series, first to $N^{th}$ comparing sections COM_1 to COM_N suitable for comparing the values stored in storage sections corresponding to them among the first to $N^{th}$ storage sections STO_1 to STO_N with an address ADD inputted to the first storage section STO_1, and a detection signal generating section 810 suitable for generating a detection signal DET. Descriptions will be made below for the case where each of the number of storage sections and the number of comparing sections is 4. Each of the number of storage sections and the number of comparing sections may be changed according to a design.

The address detection circuit will be described below in detail with reference to FIG. 8.

Each of the first to $N^{th}$ storage sections STO_1 to STO_4 may store one address. The first to $N^{th}$ storage sections STO_1 to STO_4 are connected in series. Operations of the first to $N^{th}$ storage sections STO_1 to STO_4 are controlled in response to comparison results of comparing sections corresponding to them among the first to $N^{th}$ comparing sections COM_1 to COM_4.

The first to $N^{th}$ comparing sections COM_1 to COM_4 compare values STO1_VAL to STO4_VAL stored in storage sections corresponding to them among the first to $N^{th}$ storage sections STO_1 to STO_4 with an address ADD inputted to the first storage section STO_1 when an active command ACT is activated, and generate equal signals corresponding to them among first to $N^{th}$ equal signals EQ1 to EQ4. The first to $N^{th}$ comparing sections COM_1 to COM_4 activate the equal signals corresponding to them among the first to $N^{th}$ equal signals EQ1 to EQ4 when the values STO1_VAL to STO4_VAL stored in storage sections corresponding to them among the first to $N^{th}$ storage sections STO_1 to STO_4 are the same as an inputted address ADD, and deactivate the equal signals corresponding to them among the first to $N^{th}$ equal signals EQ1 to EQ4 when the values STO1_VAL to STO4_VAL stored in storage sections corresponding to them among the first to $N^{th}$ storage sections STO_1 to STO_4 are not the same as an inputted address ADD.

The detection signal generating section 810 activates the detection signal DET based on the first to $N^{th}$ equal signals EQ1 to EQ4, and outputs one of the values STO1_VAL to STO4_VAL stored in the first to $N^{th}$ storage sections STO_1 to STO_4 as a detection address ADD_DET in the case of activating the detection signal DET. In detail, the detection signal generating section 810 activates the detection signal DET when at least one of the first to $N^{th}$ equal signals EQ1 to EQ4 is activated, and outputs the value corresponding to the activated equal signal among the values STO1_VAL to STO4_VAL stored in the first to $N^{th}$ storage sections STO_1 to STO_4, as the detection address ADD_DET. For example, the detection signal generating section 810 outputs the value STO2_VAL as the detection address ADD_DET when the equal signal EQ2 is activated. Since the same address as an inputted address ADD is stored in a storage section corresponding to an activated equal signal among the first to $N^{th}$ storage sections STO_1 to STO_4, the address detection circuit outputs the detection address ADD_DET the same as an inputted address ADD when the detection signal DET is activated.

The first to $N^{th}$ storage sections STO_1 to STO_4 do not shift the values stored therein when the detection signal DET is activated, and a storage section corresponding to an activated equal signal among the first to $N^{th}$ storage sections STO_1 to STO_4 is initialized. Initialization means that the value stored in a corresponding storage section is deleted. Since the same signal as an inputted address ADD is stored in a storage section corresponding to an activated equal signal, when the detection signal DET is activated, the address detection circuit initializes a storage section in which an address the same as an inputted address ADD is stored and deletes the address the same as the inputted address ADD.

The first to $N^{th}$ storage sections STO_1 to STO_4 shift the values stored therein when the detection signal DET is deactivated. Accordingly, the value stored in a $K^{th}$ ($1 \leq K \leq N-1$) storage section is shifted to and stored in a $K+1^{th}$ storage section. The first storage section STO_1 stores an address ADD inputted thereto when the detection signal DET is deactivated. When addresses are already stored in all of the first to $N^{th}$ storage sections STO_1 to STO_4, the value stored in the $N^{th}$ storage section STO_4 before the shifting is deleted. That is to say the address detection circuit stores maximum N number of addresses, and, when the detection signal DET is not activated with the N number of addresses stored, an inputted address ADD is stored and an address stored in the $N^{th}$ storage section STO_4, that is, an earliest stored address among currently stored addresses, is deleted.

Entire operations of the address detection circuit will be described below.

The address detection circuit detects an address, which is the same as an inputted address ADD, among the addresses already stored in the address detection circuit, when the active command ACT is activated. If an address the same as an inputted address ADD is detected, the address detection circuit activates the detection signal DET and outputs the address the same as the inputted address ADD. At the same time, the address detection circuit deletes the address the same as the inputted address ADD among the addresses stored therein. If an address the same as the inputted address ADD is not detected, the address detection circuit deactivates the detection signal DET and stores the inputted address ADD. Before the inputted address ADD is stored, the address detection circuit deletes the address stored earliest among the N number of addresses in the case where the number of the addresses stored in the address detection circuit is N.

The address detection circuit in accordance with the embodiment may detect a high input frequency address, which satisfies a predetermined condition. The high input frequency address may be used to solve concerns, which are caused due to word line disturbance.

Figure 9:
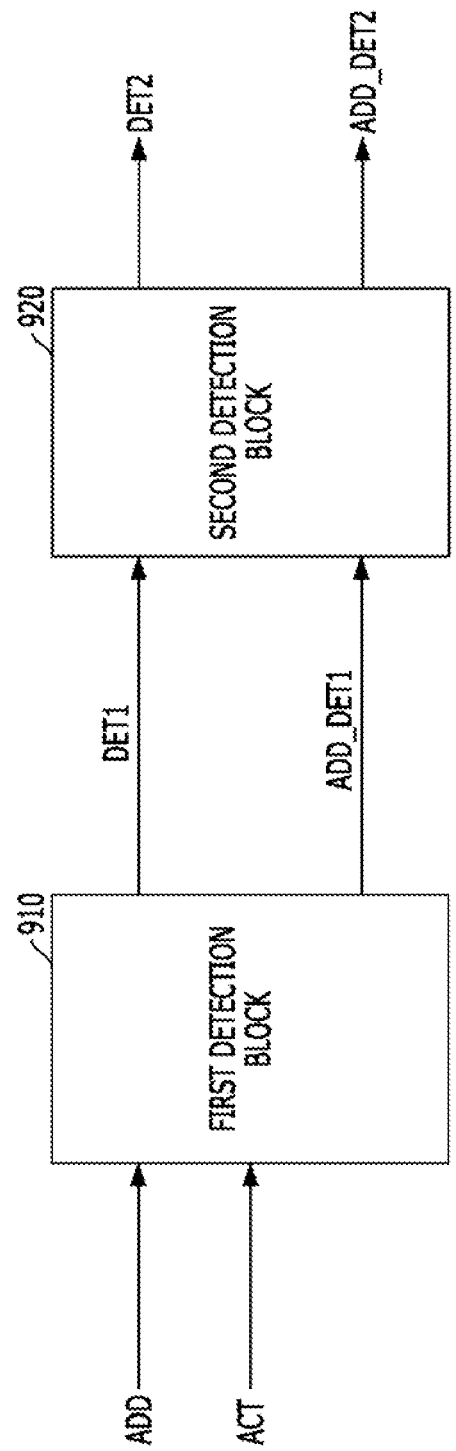
FIG. 9 is a block diagram illustrating an address detection circuit in accordance with another embodiment of the present invention.

FIG. 9 is a block diagram illustrating an address detection circuit in accordance with another embodiment according to the present invention. The address detection circuit of FIG. 9 may include at least two of the address detection circuit of FIG. 8.

Referring to FIG. 9, an address detection circuit includes a first detection block 910 suitable for storing one or more first addresses, activating a first detection signal DET1 when a first address the same as an inputted address ADD is detected among the one or more first addresses and storing the inputted address ADD when a first address the same as the inputted address ADD is not detected, and a second detection block 920 suitable for storing one or more second addresses, being inputted with a first detection address ADD_DET1 the same as the inputted address ADD when the first detection signal DET1 is activated, activating a second detection signal DET2 when a second address the same as the inputted address ADD is detected among the one or more second addresses, and storing the inputted first detection address ADD_DET1 when a second address the same as the inputted address ADD is not detected.

The address detection circuit will be described below in detail with reference to FIG. 9.

Each of the first detection block 910 and the second detection block 920 may be the same address detection circuit as the address detection circuit shown in FIG. 8. The number of addresses stored by each of the first detection block 910 and the second detection block 920 may be changed according to a design. The maximum numbers of addresses, which may be stored by the first detection block 910 and the second detection block 920 may be the same with or different from each other. The first detection block 910 may store N number of addresses at the maximum, and the second detection block 920 may store M number of addresses at the maximum. The maximum numbers of addresses, which may be stored by the first detection block 910 and the second detection block 920 are changed according to the numbers of storage sections, which are included in the first detection block 910 and the second detection block 920. In the present case, the first detection block 910 includes N number of storage sections, and the second detection block 920 includes M number of storage sections. Descriptions will be made below for the case where N=M=4. The addresses stored by the first detection block 910 are first addresses, and the addresses stored by the second detection block 920 are second addresses.

The first detection block 910 is the same as the address detection circuit of FIG. 8 in terms of the configuration and operations thereof, and the second detection block 920 is same as the address detection circuit of FIG. 8 in terms of the configuration thereof. The second detection block 920 operates in the same manner as the first detection block 910 except that the second detection block 920 performs a detecting operation when not an active command ACT but the first detection signal DET1 is activated and is inputted with the first detection address ADD_DET1 outputted from the first detection block 910. That is, when viewed from the address detection circuit of FIG. 8, the second detection block 920 is inputted with the first detection signal DET1 instead of the active command ACT and is inputted with the first detection address ADD_DET1 outputted from the first detection block 910, instead of an address ADD.

The first detection block 910 detects an address the same as an inputted address ADD among the one or more first addresses stored in the first detection block 910 when the active command ACT is activated. When the address the same as the inputted address ADD is detected, the first detection block 910 activates the first detection signal DET1 and outputs the first address the same as the inputted address ADD, as the first detection address ADD_DET1. Together with this, the first detection block 910 deletes the address the same as the inputted address ADD among the first addresses stored therein. When a first address the same as an inputted address ADD is not detected, the first detection block 910 deactivates the first detection signal DET1 and stores an inputted address ADD as a first address. Before the inputted address ADD is stored, the first detection block 910 deletes the first address stored earliest among the N number of addresses in the case where the number of the first addresses stored in the first detection block 910 is N.

The second detection block 920 activates the second detection signal DET2 when a second address the same as the first detection address ADD_DET1 outputted from the first detection block 910 is detected among the one or more second addresses stored in the second detection block 920 if the first detection signal DET1 is activated, and outputs the second address the same as the first detection address ADD_DET1 outputted from the first detection block 910, as a second detection address ADD_DET2. Together with this, the second detection block 920 deletes the second address the same as the first detection address ADD_DET1 outputted from the first detection block 910, among the second addresses stored therein. When a second address the same as the first detection address ADD_DET1 outputted from the first detection block 910 is not detected, the second detection block 920 deactivates the second detection signal DET2 and stores the first detection address ADD_DET1 outputted from the first detection block 910, as a second address. Before the first detection address ADD_DET1 outputted from the first detection block 910 is stored, the second detection block 920 deletes the second address stored earliest among the M number of addresses in the case where the number of the second addresses stored in the second detection block 920 is M.

Entire operations of the address detection circuit will be described below.

The first detection block 910 detects a first address the same as an inputted address ADD among the one or more first addresses stored therein. When the first address the same as the inputted address ADD is detected, the first detection block 910 activates the first detection signal DET1, and outputs the first address the same as the inputted address ADD, as the first detection address ADD_DET1. The second detection block 920 detects a second address the same as the first detection address ADD_DET1 among the one or more second addresses stored therein. When the second address the same as the first detection address ADD_DET1 is detected, the second detection block 920 activates the second detection signal DET2, and outputs the second address the same as the first detection address ADD_DET1, as the second detection address ADD_DET2.

The address detection circuit of FIG. 9 detects an inputted address ADD as the second detection address ADD_DET2 when the inputted address ADD is already detected as the first detection address ADD_DET1. Accordingly, the address detection circuit of FIG. 9 may detect an address with increased precision than the address detection circuit of FIG. 8. By connecting in series the address detection circuits of FIG. 8, it may be possible to design a circuit that increases precision for detecting an address. While it was described above with reference to FIG. 9 that two address detection circuits of FIG. 8 are connected in series, it is to be noted that at least three address detection circuits may be connected in series according to a design and that the design for detecting an address may yield increased precision as the number of address detection circuits connected in series increases.

The address detection circuit in accordance with the embodiment may detect a high input frequency address, which satisfies a predetermined condition. The high input frequency address may be used to solve concerns, which are caused due to word line disturbance.

Figure 10:
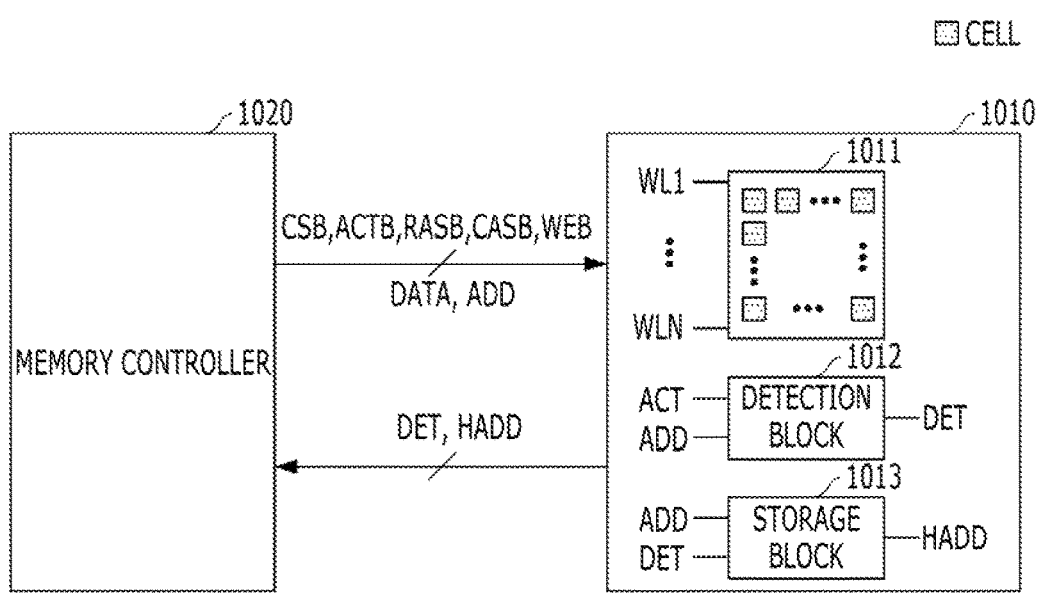
FIG. 10 is a block diagram illustrating a memory system in accordance with another embodiment of the present invention.

FIG. 10 is a block diagram illustrating a memory system in accordance with another embodiment of the present invention.

Referring to FIG. 10, a memory system includes a memory 1010 including a cell array 1011, which includes a plurality of memory cells CELLs connected to each of a plurality of word lines WL1 to WLN and a detection block 1012, which is suitable for detecting an address the same as an address ADD inputted together with an active command ACT among one or more addresses stored therein as a high input frequency address HADD and storing an inputted address ADD when a high input frequency address HADD is not detected, and a memory controller 1020 suitable for applying at least one address ADD including a high input frequency address HADD, to the memory 1010 in a special mode.

The at least one address ADD may include a high input frequency address HADD and at least one adjacent address with a value adjacent to a high input frequency address HADD. The at least one adjacent address may be the address of a word line adjacent to a word line corresponding to a high input frequency address HADD among the plurality of word lines WL1 to WLN. The adjacent value indicates an address with the value of '4' or '6' in the case where the value of a high input frequency address HADD is '5'. The memory 1010 may include a storage block 1013, which is suitable for storing an inputted address ADD when a detection signal DET is activated, and outputting the inputted address ADD as a high input frequency address HADD.

The detection block 1012 included in the memory 1010 of FIG. 10 may be one of the address detection circuit of FIG. 8 and the address detection circuit of FIG. 9. In the case where the detection block 1012 is the address detection circuit of FIG. 8, the high input frequency address HADD is an address ADD inputted when the first detection signal DET1 is activated in the address detection circuit of FIG. 8, and in the case where the detection block 1012 is the address detection circuit of FIG. 9, the high input frequency address HADD is an address ADD inputted when the second detection signal DET2 is activated in the address detection circuit of FIG. 9. Since detailed operations of the detection block 1012 are the same as described above with reference to FIG. 8 or 9, descriptions thereof will be omitted herein.

For reference, the memory controller 1020 inputs command signals including a chip select signal CSB, an active control signal ACTB, a row address strobe signal RASB, a column address strobe signal CASB and a write enable signal WEB, to the memory 1010. The application of a specific command by the memory controller 1020 to the memory 1010 means that a combination of the above command signals CSB, ACTB, RASB, CASB and WEB corresponds to the specific command. For instance, the application of the active command ACT by the memory controller 1020 to the memory 1010 means that a combination of the command signals CSB, ACTB, RASB, CASB and WEB applied by the memory controller 1020 to the memory 1010 corresponds to the active command ACT. A command decoder (not shown) included in the memory 1010 decodes the command signals CSB, ACTB, RASB, CASB and WEB and generates commands internally of the memory 1010. The memory controller 1020 applies an address ADD, data DATA and so forth to the memory 1010 in addition to the plurality of command signals CSB, ACTB, RASB, CASB and WEB, for operations of the memory 1010.

In the following descriptions, a special mode represents an operation mode for activating a word line, which is adjacent to a high activation frequency word line (i.e., a word line corresponding to a high input frequency address or a frequently activated word line) and of which the activation frequency satisfies at least a preset condition and thereby refreshing the data of a plurality of emory cells connected to the word line.

The memory system will be described below in detail with reference to FIG. 10.

In the memory 1010 the command decoder decodes the plurality of command signals CSB, ACTB, RASB, CASB and WEB applied from the memory controller 1020 and generates an active command for activating a word line, a precharge command for precharging a word line, a refresh command for refreshing memory cells, a read command for reading the data of memory cells, a write command for writing data to memory cells, and a mode register set command MRS for setting a mode register.

In a general operation mode, the memory 1010 activates a word line corresponding to an inputted address ADD and accesses the memory cells, which are connected to the activated word line (i.e., performs a data read operation or a data write operation). The detection block 1012 detects a high input frequency address in response to the active command ACT and an address ADD, and activates the detection signal DET when the high input frequency address is detected. The storage block 1013 stores an address ADD when the detection signal DET is activated. The address ADD stored in the storage block 1013 becomes a high input frequency address HADD. The memory 1010 inputs a high input frequency address HADD to the memory controller 1020.

When the detection signal DET is activated, the memory controller 1020 may control the memory 1010 to perform an operation under the special mode. The memory controller 1020 may cause the memory to enter the special mode immediately when the detection signal DET is activated, or may cause the memory 1010 to enter the special mode when a predetermined time has passed after the detection signal DET was activated. The memory 1010 operates under the special mode from a time when it enters the special mode to a time when it exits the special mode.

When the detection signal DET is activated, the memory controller 1020 causes the memory 1010 to enter the special mode by a combination of the plurality of command signals CSB, ACTB, RASB, CASB and WEB and the address ADD. If the memory 1010 enters the special mode, the memory controller 1020 sequentially applies a high input frequency address L and addresses L+1 and L−1 corresponding to word lines adjacent to a word line corresponding to the high input frequency address L, together with the active command ACT. The memory 1010 activates an $L^{th}$ word line WLL, an $L+1^{th}$ word line WLL+1 and an $L−1^{th}$ word line WLL−1 respectively corresponding to the addresses L, L+1 and L−1, in response to the active command ACT. If the operation under the special mode is completed, the memory controller 1020 causes the memory 1010 to exit the special mode by a combination of the plurality of command signals CSB, ACTB, RASB, CASB and WEB and the address ADD.

In the memory system in accordance with the embodiment, a predetermined condition is set, and an address satisfying such a condition is detected and stored as a high input frequency address and is inputted to the memory controller 1020 to allow the memory 1010 to operate in the special mode. Accordingly, by refreshing the memory cells connected to word lines adjacent to a high activation frequency word line, it may be possible to prevent data from being degraded due to word line disturbance.

Figure 11:
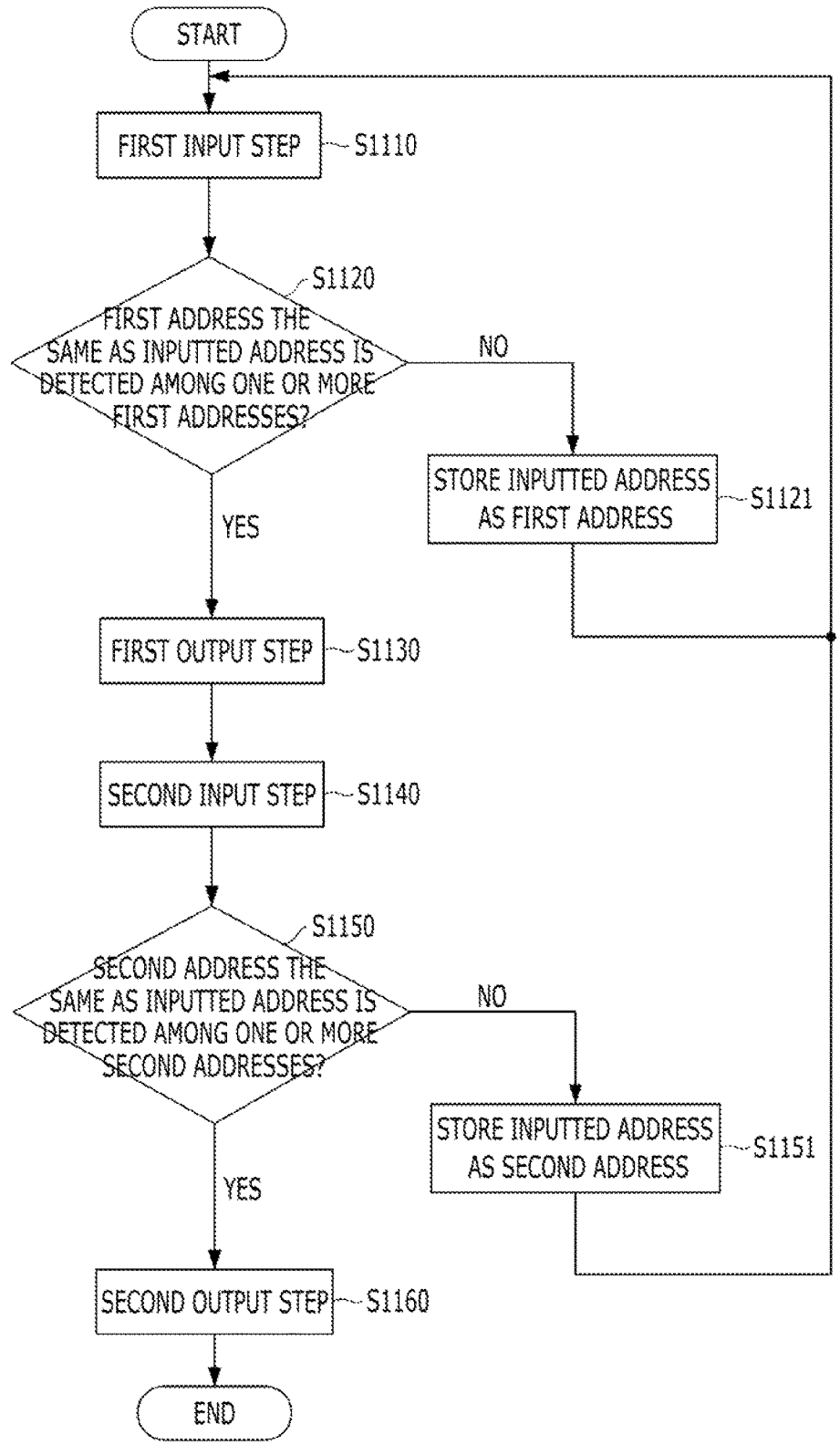
FIG. 11 is a flow chart illustrating an address detection method in accordance with another embodiment of the present invention.

FIG. 11 is a flow chart illustrating an address detection method in accordance with another embodiment of the present invention.

Referring to FIG. 11, an address detection method includes step S1110 of receiving an input of an address (hereinafter, referred to as first input step S1110), step S1120 of detecting a first address the same as an inputted address ADD among one or more stored first addresses (hereinafter, referred to as first detection step S1120), and step S1130 of outputting the first address the same as the inputted address ADD, as a first detection address ADD_DET1, when the first address the same as the inputted address ADD is detected, and storing the inputted address ADD when the first address the same as the inputted address ADD is not detected (hereinafter, referred to as first output step S1130).

The address detection method further includes step S1140 of receiving an input of the first detection address ADD_DET1 the same as the inputted address ADD when the first address the same as the inputted address ADD is detected, so as to detect an address in a strict condition, (hereinafter, referred to as second input step S1140), step S1150 of detecting a second address the same as the inputted first detection address ADD_DET1 among one or more stored second addresses (hereinafter, referred to as second detection step S1150), and step S1160 of outputting the second address the same as the inputted first detection address ADD_DET1, as a second detection address ADD_DET2, when the second address the same as the inputted first detection address ADD_DET1 is detected, and storing the inputted first detection address ADD_DET1 when the second address the same as the inputted first detection address ADD_DET1 is not detected (hereinafter, referred to as second output step S1160).

The address detection method will be described below in detail with reference to FIGS. 8, 9 and 11.

The address ADD inputted in the first input step S1110 is compared with the one or more stored first addresses when an active command ACT is activated, and the first address the same as the inputted address ADD is detected based on a comparison result, in the first detection step S1120. If the first address the same as the inputted address ADD is not detected in the first detection step S1120, the inputted address ADD is stored as a first address (step S1121) and the process returns to the first input step S1110. If the first address the same as the inputted address ADD is detected in the first detection step S1120, the first address the same as the inputted address ADD is outputted as the first detection address ADD_DET1 in the first output step S1130, and at this time, the first address the same as the inputted address ADD among the one or more first addresses is deleted.

The first detection address ADD_DET1 inputted in the second input step S1140 is compared with the one or more stored second addresses when a first detection signal DET1 is activated, and the second address the same as the inputted first detection address ADD_DET1 is detected based on a comparison result, in the second detection step S1150. If the second address the same as the inputted first detection address ADD_DET1 is not detected in the second detection step S1150, the inputted first detection address ADD_DET1 is stored as a second address (step S1151) and the process returns to the first input step S1110. If the second address the same as the inputted first detection address ADD_DET1 is detected in the second detection step S1150, the second address the same as the inputted first detection address ADD_DET1 is outputted as the second detection address ADD_DET2 in the second output step S1160, and at this time, the second address the same as the inputted first detection address ADD_DET1 among the one or more second addresses is deleted.

The address detection method in accordance with the embodiment may detect a high input frequency address, which satisfies a predetermined condition. The high input frequency address may be used to solve concerns, which are caused due to word line disturbance.

Although various embodiments have been described for illustrative purposes, it will be apparent to those skilled in the art that various changes and modifications may be made without departing from the spirit and scope of the invention as defined in the following claims.

What is claimed:
1. An address detection circuit comprising:
   an address storage unit receiving an address when an active command is activated, and storing recently inputted N number of addresses; and an address determination unit comparing an input address to each of the N number of addresses stored in the address storage unit, and determining whether the input address is already inputted at least a threshold number of times in each period that the active command is activated M (1≤M≤N) number of times, wherein the input address is currently inputted to the address storage unit.

2. The address detection circuit according to claim 1, wherein the address storage unit deletes an earliest stored address among the stored N number of addresses when the input address is inputted, and stores the input address.

3. The address detection circuit according to claim 1, wherein the address storage unit comprises first to Nth storage sections each of which storing an address, and wherein the first to Nth storage sections are connected in series, and a Kth (2≤K≤N−1) storage section outputs a value stored therein to a K+1th storage section and stores a value outputted from a K−1th storage section.

4. The address detection circuit according to claim 3, wherein the first storage section stores the input address, and when an address outputted from the N−1th storage section is inputted to the Nth storage section, a value stored in the Nth storage section is deleted.

5. The address detection circuit according to claim 3, wherein the address determination unit comprises:
first to Nth comparing sections comparing addresses stored in corresponding storage sections among the first to Nth storage sections with the input address; and
a detection signal generating section activating a detection signal when the number of address, which is the same as the input address, among each M number of addresses stored in first to Lth (N=M×L) groups, is equal to or greater than the threshold number of times, based on comparison results of the first to Nth comparing sections,
wherein first to Lth groups include M number of storage sections among the first to Nth storage sections.

6. The address detection circuit according to claim 1, wherein the address storage unit is initialized when the input is inputted the at least threshold number of times in each period.

7. An address detection circuit comprising:
first to Nth storage sections connected in series, and shifting values stored therein and the first storage section stores the address inputted thereto when a detection signal is deactivated;
first to Nth comparing sections comparing values stored in corresponding storage sections among the first to Nth storage sections with an input address, and activating a corresponding equal signal among first to Nth equal signals when the input address is the same as the values stored in corresponding storage sections; and
a detection signal generating section activating the detection signal when at least one of the first to Nth equal signals is activated.

8. The address detection circuit according to claim 7, wherein, when the detection signal is activated, a storage section in which an address the same as the address inputted to the first storage section is stored is initialized among the first to Nth storage sections.

9. The address detection circuit according to claim 7, wherein, when the detection signal is activated, the address the same as the address inputted to the first storage section is outputted.

10. The address detection circuit according to claim 7, wherein, when addresses are stored in all of the first to Nth storage sections and an address the same as the address inputted to the first storage section is not detected, a value stored in the Nth storage section before the shifting is deleted.

11. An address detection circuit comprising:
a first detection block storing one or more first addresses, activating a first detection signal when a first address the same as an inputted address is detected among the one or more first addresses and storing the inputted address when a first address the same as the inputted address is not detected; and
a second detection block storing one or more second addresses, receiving the first detection address the same as the inputted address when the first detection signal is activated, activating a second detection signal when a second address the same as the inputted address is detected among the one or more second addresses, and storing the inputted first detection address when a second address the same as the inputted address is not detected.

12. The address detection circuit according to claim 11, wherein the first detection block outputs the first detection address the same as the inputted address when a first address the same as an inputted address is detected, and wherein the second detection block outputs the second detection address the same as the inputted address when a second address the same as an inputted address is detected.

13. The address detection circuit according to claim 11, wherein the first detection block deletes the address the same as the inputted address among the one or more first addresses when the first detection signal is activated, and
wherein the second detection block deletes the address the same as the inputted address among the one or more second addresses when the second detection signal is activated.

14. The address detection circuit according to claim 11, wherein the first detection block stores N number of first addresses at the maximum, and, in the case where the number of stored first addresses is N and an address the same as the inputted address is not detected among the N number of first addresses, an earliest stored first address is deleted among the N number of first addresses and the inputted address is stored, and
wherein the second detection block stores M number of second addresses at the maximum, and, in the case where the number of stored second addresses is M and an address the same as the inputted address is not detected among the M number of second addresses, an earliest stored second address is deleted among the M number of second addresses and the inputted first detection address is stored.

15. The address detection circuit according to claim 14, wherein the first detection block comprises:
first to Nth storage sections connected in series and each storing one first address of the one or more first addresses; and
first to Nth comparing sections comparing first addresses stored in corresponding storage sections among the first to Nth storage sections with an address inputted to the first storage section,
wherein, based on comparison results of the first to Nth comparing sections, when an address the same as the inputted address is detected among first addresses stored in the first to Nth storage sections, the first to Nth storage sections activate the first detection signal, and, when an address the same as the inputted address is not detected, the first to Nth storage sections shift values stored therein and the first storage section stores the address inputted thereto.

16. The address detection circuit according to claim 15, wherein, when the first detection signal is activated, a storage section in which a first address the same as the inputted address is stored is initialized among the first to Nth storage sections.

17. The address detection circuit according to claim 14, wherein the second detection block comprises:
   first to Mth storage sections connected in series and each storing one second address; and
   first to Mth comparing sections comparing second addresses stored in corresponding storage sections among the first to Mth storage sections with the first detection address inputted to the first storage section,
   wherein, based on comparison results of the first to Mth comparing sections, when a second address the same as the inputted first detection address is detected among second addresses stored in the first to Mth storage sections, the first to Mth storage sections activate the second detection signal, and, when a second address the same as the inputted first detection address is not detected, the first to Mth storage sections shift values stored therein and the first storage section stores the first detection address inputted thereto.

18. The address detection circuit according to claim 15, wherein, when the second detection signal is activated, a storage section in which a second address the same as the inputted first detection address is stored is initialized among the first to Mth storage sections.

* * * * *